(12) United States Patent
Ito et al.

(10) Patent No.: US 12,308,261 B2
(45) Date of Patent: May 20, 2025

(54) SUBSTRATE PROCESSING APPARATUS AND SUBSTRATE PROCESSING METHOD

(71) Applicant: SCREEN HOLDINGS CO., LTD., Kyoto (JP)

(72) Inventors: Akira Ito, Kyoto (JP); Takahiro Yamaguchi, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 364 days.

(21) Appl. No.: 17/587,440

(22) Filed: Jan. 28, 2022

(65) Prior Publication Data

US 2022/0301900 A1 Sep. 22, 2022

(30) Foreign Application Priority Data

Mar. 22, 2021 (JP) ................. 2021-047503

(51) Int. Cl.
*H01L 21/67* (2006.01)

(52) U.S. Cl.
CPC .. *H01L 21/67115* (2013.01); *H01L 21/67023* (2013.01)

(58) Field of Classification Search
None
See application file for complete search history.

(56) References Cited

U.S. PATENT DOCUMENTS

| | | | |
|---|---|---|---|
| 5,332,442 A | 7/1994 | Kubodera et al. | |
| 5,525,160 A | 6/1996 | Tanaka et al. | |
| 6,121,579 A | 9/2000 | Aoki et al. | |
| 8,056,257 B2* | 11/2011 | Ohno | H01L 21/02052 34/381 |
| 8,877,076 B2* | 11/2014 | Negoro | H01L 21/31111 134/186 |
| 9,245,777 B2* | 1/2016 | Plazonic | H05B 3/0047 |
| 9,343,311 B2* | 5/2016 | Kato | H01L 21/02321 |
| 9,553,003 B2* | 1/2017 | Hayashi | H01L 21/67028 |

(Continued)

FOREIGN PATENT DOCUMENTS

| | | |
|---|---|---|
| CN | 103215549 A | 7/2013 |
| CN | 106257639 A | 12/2016 |

(Continued)

OTHER PUBLICATIONS

Korean Office Action dated Dec. 1, 2023 issued in the corresponding Korean Patent Application No. 10-2022-0004078, with English machine translation.

(Continued)

*Primary Examiner* — Jethro M. Pence
(74) *Attorney, Agent, or Firm* — Rimon P.C.

(57) ABSTRACT

A light emitting element is positioned at a position right below one principal surface of a substrate rotating about an axis of rotation and away from an end surface of the substrate toward the axis of rotation. The light emitting element is arranged as to be inclined from a horizontal plane so that the light emitting surface faces a peripheral edge part of the substrate. Light emitted from the light emitting surface of the light emitting element is irradiated to a lower surface peripheral edge part of the substrate or a region near the lower surface peripheral edge part. As a result, a processing by the processing liquid is possible in a short time.

8 Claims, 8 Drawing Sheets

(56) References Cited

U.S. PATENT DOCUMENTS

| | | | |
|---|---|---|---|
| 9,640,382 B2* | 5/2017 | Masuhara | H01L 21/6715 |
| 9,640,383 B2* | 5/2017 | Aiura | G03F 7/42 |
| 9,748,120 B2* | 8/2017 | Crabb | H01L 21/67115 |
| 9,768,011 B2* | 9/2017 | Okutani | H01L 21/0206 |
| 9,892,943 B2* | 2/2018 | Ma | B32B 38/1841 |
| 9,899,229 B2* | 2/2018 | Hinode | H01L 21/6708 |
| 9,991,141 B2* | 6/2018 | Muramoto | B08B 3/04 |
| 10,032,654 B2* | 7/2018 | Negoro | H01L 21/30604 |
| 10,332,761 B2* | 6/2019 | Kobayashi | H01L 21/6708 |
| 10,460,961 B2* | 10/2019 | Nagashima | H01L 21/02052 |
| 10,573,542 B2* | 2/2020 | Muramoto | H01L 21/67115 |
| 10,591,820 B2* | 3/2020 | Harumoto | G03F 7/38 |
| 10,658,204 B2* | 5/2020 | Hill | H01L 21/67115 |
| 10,755,951 B2* | 8/2020 | Izumoto | H01L 21/6708 |
| 10,861,719 B2* | 12/2020 | Mui | H01L 21/67051 |
| 10,985,038 B2* | 4/2021 | Naohara | H01L 21/67051 |
| 11,075,095 B2* | 7/2021 | Kobayashi | H01L 21/67028 |
| 11,195,730 B2* | 12/2021 | Obweger | H01L 21/31133 |
| 11,289,324 B2* | 3/2022 | Okutani | H01L 21/0206 |
| 11,318,504 B2* | 5/2022 | Kawaguchi | B08B 3/08 |
| 11,373,860 B2* | 6/2022 | Otsuji | H01L 21/67103 |
| 11,437,229 B2* | 9/2022 | Then | H01L 21/67028 |
| 11,465,167 B2* | 10/2022 | Abe | B08B 3/10 |
| 11,469,116 B2* | 10/2022 | Hidaka | B08B 3/10 |
| 11,551,945 B2* | 1/2023 | Morikawa | H01L 21/67023 |
| 11,604,415 B2* | 3/2023 | Yamauchi | H01L 21/6715 |
| 11,612,017 B2* | 3/2023 | Sekimoto | H01L 21/67253 |
| 11,637,035 B2* | 4/2023 | Morita | H01L 21/67109 219/444.1 |
| 11,664,243 B2* | 5/2023 | Park | H01L 21/6708 156/345.23 |
| 11,765,793 B2* | 9/2023 | Lee | H01L 21/68714 392/411 |
| 11,883,858 B2* | 1/2024 | Kawaguchi | H01L 21/304 |
| 11,923,213 B2* | 3/2024 | Kim | H01L 21/268 |
| 11,935,736 B2* | 3/2024 | Higuchi | H01L 21/67028 |
| 12,046,465 B2* | 7/2024 | Okutani | H01L 21/6708 |
| 2005/0260771 A1 | 11/2005 | Iwashita et al. | |
| 2008/0017613 A1 | 1/2008 | Nogami et al. | |
| 2008/0073324 A1 | 3/2008 | Nogami et al. | |
| 2008/0189975 A1 | 8/2008 | Miya | |
| 2013/0174873 A1 | 7/2013 | Yoshihara et al. | |
| 2013/0186338 A1 | 7/2013 | Tsai et al. | |
| 2013/0260574 A1* | 10/2013 | Masuhara | H01L 21/02019 438/782 |
| 2014/0060573 A1* | 3/2014 | Yoshida | H01L 21/67051 134/105 |
| 2014/0227883 A1* | 8/2014 | Izumoto | H01L 21/67028 156/345.37 |
| 2014/0231012 A1* | 8/2014 | Hinode | C09K 13/04 156/345.23 |
| 2015/0270146 A1 | 9/2015 | Yoshihara et al. | |
| 2016/0064242 A1* | 3/2016 | Obweger | H01L 21/6708 134/1 |
| 2016/0372340 A1 | 12/2016 | Takeaki et al. | |
| 2019/0096705 A1 | 3/2019 | Abe et al. | |
| 2019/0318946 A1 | 10/2019 | Kim | |
| 2020/0035516 A1 | 1/2020 | Ikeda et al. | |
| 2020/0146111 A1* | 5/2020 | Sekimoto | H01L 21/67051 |
| 2020/0152447 A1 | 5/2020 | Sasaki et al. | |
| 2020/0194281 A1* | 6/2020 | Yoshida | H01L 21/02057 |
| 2020/0395210 A1 | 12/2020 | Kwon et al. | |
| 2022/0068698 A1* | 3/2022 | Jeong | H01L 21/68764 |
| 2022/0157645 A1* | 5/2022 | Song | H01L 21/68728 |
| 2022/0181168 A1* | 6/2022 | Yun | H01L 21/68728 |
| 2022/0319875 A1* | 10/2022 | Taruno | H01L 21/67034 |
| 2022/0390848 A1* | 12/2022 | Choi | G03F 7/30 |
| 2022/0392780 A1* | 12/2022 | Yoshida | H01L 21/02057 |
| 2023/0069633 A1* | 3/2023 | Suzuki | H01L 21/67028 |
| 2023/0119960 A1* | 4/2023 | Son | H01L 21/67023 134/105 |
| 2023/0203669 A1* | 6/2023 | Kang | H01L 21/6708 156/345.15 |
| 2023/0205091 A1* | 6/2023 | Yoon | G03F 1/80 425/174.4 |
| 2023/0205100 A1* | 6/2023 | Son | H01L 21/67051 355/30 |
| 2023/0207350 A1* | 6/2023 | Kim | H01L 21/68764 134/1 |
| 2023/0343597 A1* | 10/2023 | Horikiri | H01L 21/30612 |
| 2023/0360933 A1* | 11/2023 | Kim | G02B 27/0955 |
| 2024/0035166 A1* | 2/2024 | Lee | H01L 21/67115 |
| 2024/0096663 A1* | 3/2024 | Song | H01L 21/67109 |
| 2024/0116087 A1* | 4/2024 | Kawaguchi | B08B 3/08 |
| 2024/0136205 A1* | 4/2024 | Fukushima | H01L 21/67051 |
| 2024/0222159 A1* | 7/2024 | Choi | H01L 21/6708 |

FOREIGN PATENT DOCUMENTS

| | | |
|---|---|---|
| CN | 109545706 A | 3/2019 |
| CN | 111180360 A | 5/2020 |
| CN | 112091432 A | 12/2020 |
| JP | H05-144406 A | 6/1993 |
| JP | H06-326078 A | 11/1994 |
| JP | H09-237763 A | 9/1997 |
| JP | H09-275088 A | 10/1997 |
| JP | 2004-096086 A | 3/2004 |
| JP | 2006-049870 A | 2/2006 |
| JP | 2014-154858 A | 8/2014 |
| JP | 2015-185806 A | 10/2015 |
| JP | 2017-011011 A | 1/2017 |
| JP | 2017-011015 A | 1/2017 |
| JP | 2021-009864 A | 1/2021 |
| KR | 10-2013-0086106 A | 7/2013 |
| TW | 201342458 A | 10/2013 |
| TW | 202004889 A | 1/2020 |
| TW | 202011500 A | 3/2020 |

OTHER PUBLICATIONS

Taiwanese Office Action issued in corresponding Taiwanese Patent Application No. 111101411, dated Jan. 10, 2023.
Office Action dated Jun. 28, 2024 from corresponding Chinese Application No. 202210026498.3, 15 pages.
Office Action dated Nov. 19, 2024, from corresponding Japanese Patent Application No. 2021-047503, 7 pages.
Office Action dated Dec. 6, 2024, from corresponding Chinese Patent Application No. 202210026498.3, 8 pages (non-English).
Notice of Allowance dated Jan. 21, 2025, from corresponding Japanese Application No. 2021-047503, 6 pages.

* cited by examiner

DISTANCE FROM END SURFACE OF SUBSTRATE
TO CENTER POSITION OF LIGHT EMITTING ELEMENT

SUBSTRATE PROCESSING APPARATUS AND SUBSTRATE PROCESSING METHOD

CROSS REFERENCE TO RELATED APPLICATION

The disclosure of Japanese Patent Application No. 2021-047503 filed on Mar. 22, 2021 including specification, drawings and claims is incorporated herein by reference in its entirety.

BACKGROUND OF THE INVENTION

1. Field of the Invention

This invention relates to a substrate processing apparatus for processing a semiconductor wafer, glass substrate for liquid crystal device, glass substrate for plasma display, substrate for optical disc, substrate for magnetic disc, substrate for magneto-optical disc, glass substrate for photomask, substrate for solar cell or the like (hereinafter, merely referred to as a "substrate") by supplying a processing liquid while heating the substrate in a non-contact manner.

2. Description of the Related Art

An apparatus described in JP 2017-11015A is, for example, known as a substrate processing apparatus for applying a chemical treatment, cleaning treatment or the like by supplying a processing liquid to a surface to be processed of a substrate such as a semiconductor wafer rotating about an axis of rotation while applying a heating treatment to the substrate. In this substrate processing apparatus, an annular heater with a built-in heating body extends in a circumferential direction of the substrate along a lower surface peripheral edge part of the substrate to heat the lower surface (surface to be heated) opposite to the upper surface (surface to be processed) of the substrate.

SUMMARY OF THE INVENTION

It has been studied in recent years to use a light emitting element such as an LED (Light Emitting Diode) instead of the heating body as a heating source for heating a substrate in a non-contact manner. For example, an ultraviolet light emitting LED (model number: NVCUQ096A-D4) produced by Nichia Corporation can be used as a heating source. In the above LED, a plurality of light emitters are planarly arranged on one principal surface of an element substrate and function as a light emitting surface. In the case of applying a heating treatment by the thus configured LED, the LED is preferably arranged at a position right below a lower surface peripheral edge part of a substrate or the vicinity of this lower surface peripheral edge part as described later with reference to FIG. 7. However, in an actual substrate processing apparatus, various components are disposed around a substrate. For example, a splash guard, a mechanism for driving the splash guard and the like are arranged around the substrate to receive a processing liquid and the like scattering from the substrate during a substrate processing. Due to such layout restrictions of the apparatus components, a space allowing the arrangement of the LED is limited to a position right below the lower surface of the substrate and away from an end surface of the substrate toward an axis of rotation. Thus, it is desired to provide a substrate processing apparatus capable of shortening a tact time by quickly heating a peripheral edge part of a substrate while being subject to such placement restrictions.

This invention was developed in view of the above problem and aims to enable the execution of a processing by a processing liquid in a short time by efficiently heating a peripheral edge part of a substrate by light emitted from a light emitting element arranged at a position right below one principal surface of the substrate rotating about an axis rotation and away from an end surface of the substrate toward the axis of rotation.

A first aspect of the invention is a substrate processing apparatus, comprising: a substrate holder configured to hold a substrate substantially horizontally, the substrate holder being rotatable about a predetermined axis of rotation; a rotating mechanism configured to rotate the substrate holder about the axis of rotation; a heating mechanism configured to heat the substrate by irradiating light to one principal surface of the substrate, the light being emitted from a light emitting surface of a light emitting element arranged at a position right below the one principal surface of the substrate rotating about the axis of rotation and away from an end surface of the substrate toward the axis of rotation; and a processing liquid discharge mechanism configured to discharge a processing liquid to another principal surface of the substrate heated by the heating mechanism, wherein the light emitting element is arranged as to be inclined from a horizontal plane so that the light emitting surface faces a peripheral edge part of the substrate.

A second aspect of the invention is a substrate processing method, comprising: heating a substrate by irradiating light to one principal surface of the substrate from a light emitting surface of a light emitting element arranged at a position right below the one principal surface of the substrate rotating about an axis of rotation and away from an end surface of the substrate toward the axis of rotation with the light emitting surface inclined from a horizontal plane to face a peripheral edge part of the substrate.

In the invention thus configured, the light emitting element is used as a heating source for heating the peripheral edge part of the substrate, but the arrangement thereof is limited to the position right below the one principal surface of the substrate rotating about the axis of rotation and away from the end surface of the substrate toward the axis of rotation. However, the light emitting element is arranged obliquely from the horizontal plane so that the light emitting surface faces the peripheral edge part of the substrate. Thus, the light emitted from the light emitting surface of the light emitting element is irradiated to a lower surface peripheral edge part of the substrate or a region near the lower surface peripheral edge part.

According to this invention, the arrangement of the light emitting element is limited to the position right below the one principal surface of the substrate rotating about the axis of rotation and away from the end surface of the substrate toward the axis of rotation, but the peripheral edge part of the substrate can be efficiently heated by the light emitted from the light emitting element arranged at this position. As a result, a processing by the processing liquid is possible in a short time.

All of a plurality of constituent elements of each aspect of the invention described above are not essential and some of the plurality of constituent elements can be appropriately changed, deleted, replaced by other new constituent elements or have limited contents partially deleted in order to solve some or all of the aforementioned problems or to achieve some or all of effects described in this specification.

Further, some or all of technical features included in one aspect of the invention described above can be combined with some or all of technical features included in another aspect of the invention described above to obtain one independent form of the invention in order to solve some or all of the aforementioned problems or to achieve some or all of the effects described in this specification.

DETAILED DESCRIPTION OF THE PREFERRED EMBODIMENTS

Figure 1:
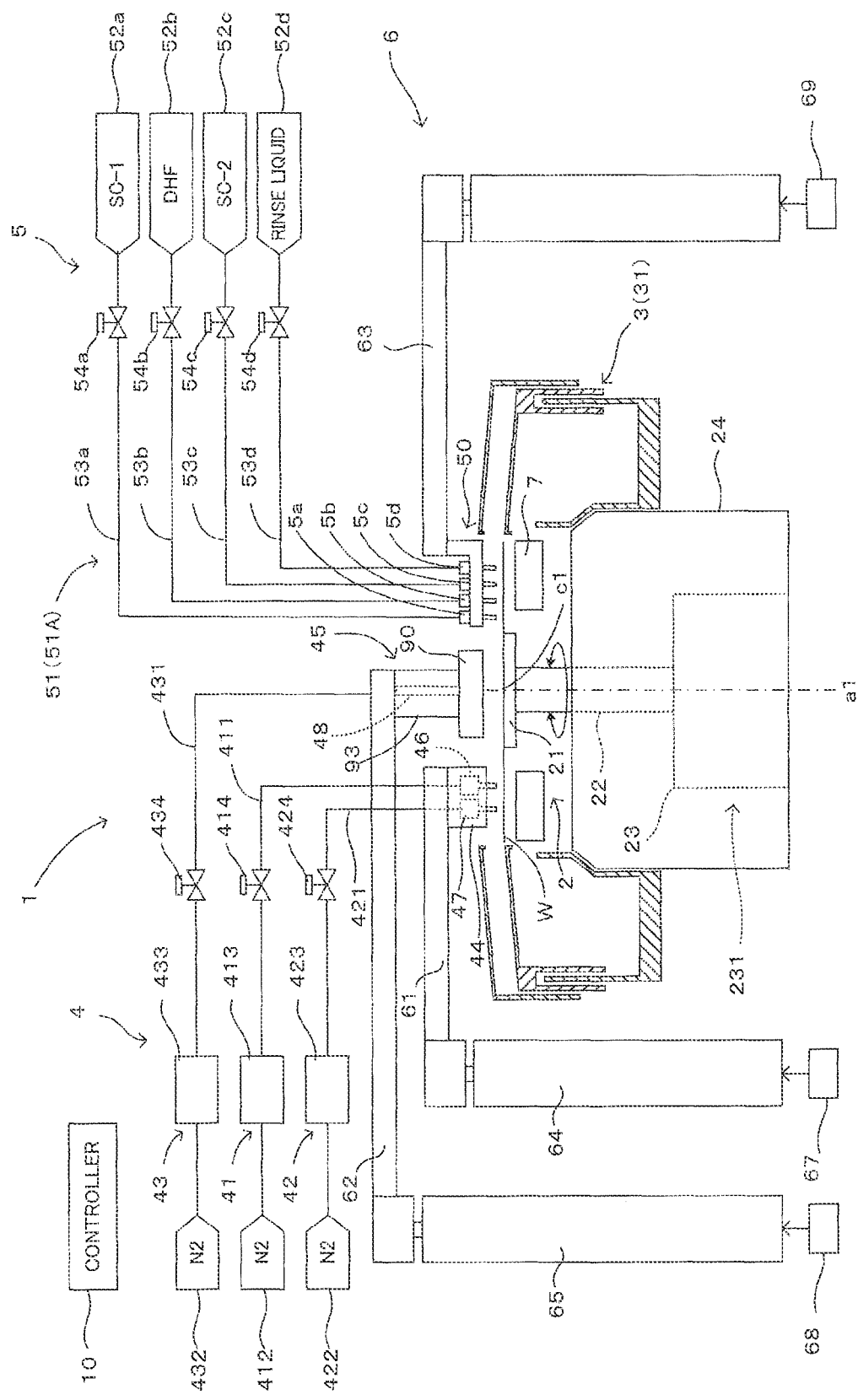
FIG. 1 is a diagram showing a first embodiment of a substrate processing apparatus according to the invention.
Figure 2:
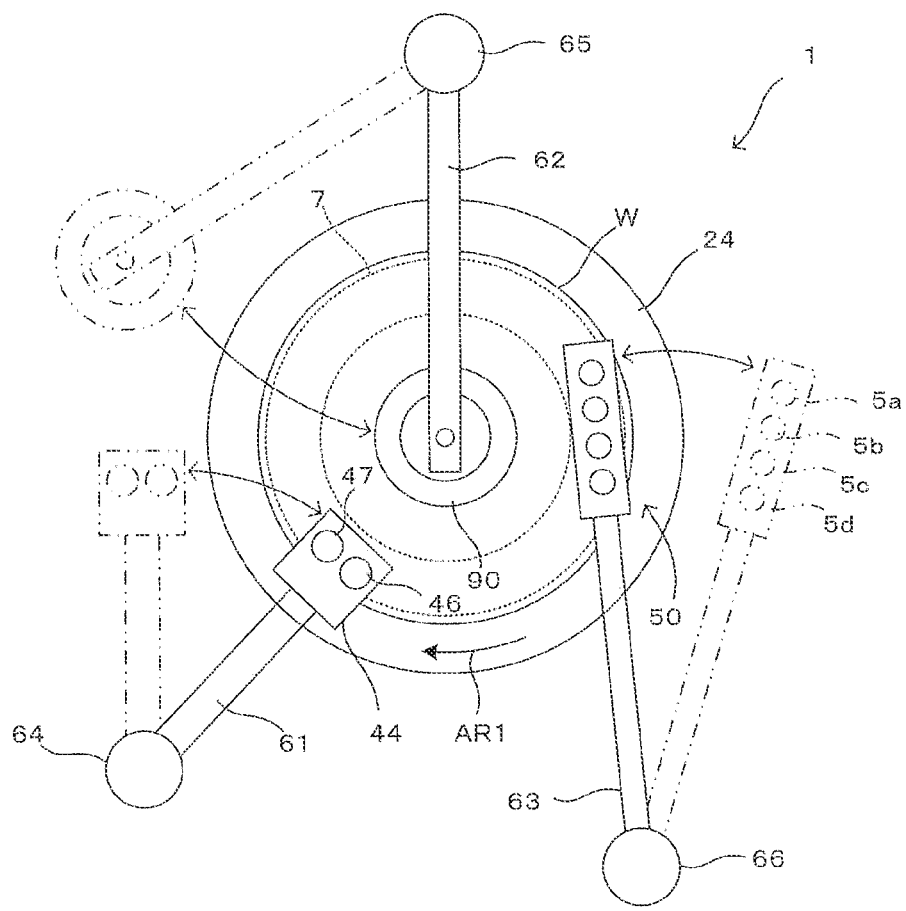
FIG. 2 is a plan view of the substrate processing apparatus shown in FIG. 1 viewed from above.

FIG. 1 is a diagram showing a first embodiment of a substrate processing apparatus according to the invention. FIG. 2 is a plan view of the substrate processing apparatus shown in FIG. 1 viewed from above. Note that, in each figure to be referred to below, dimensions and numbers of components may be shown in an exaggerated or simplified manner to facilitate understanding. An up-down direction is a vertical direction and a substrate is on an upper side with respect to a spin chuck.

The substrate processing apparatus 1 includes a rotating/holding mechanism 2, a scattering preventer 3, a surface protector 4, a processor 5, a nozzle moving mechanism 6, a heating mechanism and a controller 10. These components 2 to 7 are electrically connected to the controller 10 and operate in response to an instruction from the controller 10. A controller similar to a general computer can be, for example, adopted as the controller 10. That is, the controller 10 includes, for example, a CPU for performing various arithmetic processings, a ROM as a read-only memory for storing a basic program, a RAM as a read/write memory for storing various pieces of information, a magnetic disc for storing control software, data, etc. and the like. In the controller 10, the CPU serving as a main controller performs arithmetic processings in accordance with a procedure described in the program, thereby controlling each component of the substrate processing apparatus 1.

The rotating/holding mechanism 2 is a mechanism rotatable while holding a substrate W in a substantially horizontal posture with a surface of the substrate W facing upward. The rotating/holding mechanism 2 rotates the substrate W about a vertical axis of rotation a1 passing through a center c1 of a principal surface of the substrate W. The rotating/holding mechanism 2 includes a spin chuck ("substrate holder") 21, which is a disk-like member smaller than the substrate W. The spin chuck 21 is so provided that the upper surface thereof is substantially horizontal and a center axis thereof coincides with the axis of rotation a1. A hollow cylindrical rotary shaft 22 is coupled to the lower surface of the spin chuck 21. The rotary shaft 22 extends in the vertical direction with an axis thereof coinciding with the axis of rotation a1. Further, a rotational driver (e.g. motor) 23 is connected to the rotary shaft 22. The rotational driver 23 rotationally drives the rotary shaft 22 about an axis thereof. Thus, the spin chuck 21 is rotatable about the axis of rotation a1 together with the rotary shaft 22. The rotational driver 23 and the rotary shaft 22 constitute a rotating mechanism 231 for rotating the spin chuck 21 about the axis of rotation a1. The rotational driver 23 and the rotary shaft 22 are stored in a tubular casing 24.

An unillustrated through hole is provided in a central part of the spin chuck 21 and communicates with an internal space of the rotary shaft 22. An unillustrated pump is connected to the internal space via unillustrated pipe and on-off valve. These pump and on-off valve are electrically connected to the controller 10. The controller 10 controls the operations of these pump and on-off valve. This pump can selectively supply a negative pressure and a positive pressure in accordance with a control of the controller 10. If the pump supplies the negative pressure with the substrate W placed in the substantially horizontal posture on the upper surface of the spin chuck 21, the spin chuck 21 sucks and holds the substrate W held in the substantially horizontal posture and having an upper surface Wu facing upward from below. If the pump supplies the positive pressure, the substrate W can be removed from the upper surface of the spin chuck 21.

In this configuration, if the rotational driver 23 rotates the rotary shaft 22 with the substrate W sucked and held by the spin chuck 21, the spin chuck 21 is rotated about an axis along the vertical direction. In this way, the substrate W held on the spin chuck 21 is rotated in a direction of an arrow AR1 about the vertical axis of rotation a1 passing through the center c1 in the surface of the substrate W.

Note that a method for holding the substrate W is not limited to this and a so-called mechanical chuck method for holding the substrate W by a plurality of (e.g. six) chuck pins may be adopted.

The scattering preventer 3 receives the processing liquid and the like scattering from the substrate W being rotated together with the spin chuck 21. The scattering preventer 3 includes a splash guard 31. The splash guard 31 is a tubular member with an open upper end, and provided to surround the rotating/holding mechanism 2. A guard driving mechanism for moving the splash guard 31 upward and downward is connected to the splash guard 31, and driven in response to an elevation command from the controller 10.

The surface protector 4 includes gas discharge mechanisms for discharging gas flows of inert gas such that the gas flows contact a peripheral edge part of an upper surface Wu of the substrate W held and rotating on the spin chuck 21.

The "inert gas" is gas poor in reactivity with a material of the substrate W and a thin film formed on the surface of the substrate W and is, for example, nitrogen ($N_2$) gas, argon gas or helium gas. The gas discharge mechanisms include gas discharge mechanisms 41, 42. The gas discharge mechanisms 41, 42 discharge the inert gas as gas flows, for example, in the form of gas columns. The gas discharge mechanism 42 discharges the gas flow of the inert gas such that the gas flow contacts a position upstream in a rotating direction of the substrate W of a position on the peripheral edge part of the substrate W on which the gas flow discharged from the gas discharge mechanism 41 contacts.

The surface protector 4 further includes a gas discharge mechanism 43 for discharging a gas flow of the inert gas to the vicinity of a center of the upper surface Wu of the substrate W held and rotating on the spin chuck 21. The surface protector 4 protects a non-processing region of the upper surface Wu of the substrate W from the processing liquid and the like discharged to contact an annular processing region specified on the peripheral edge part of the upper surface Wu of the substrate W by discharging the gas flows of the inert gas to the upper surface Wu of the substrate W from the gas discharge mechanisms 41 to 43.

The gas discharge mechanisms 41, 42 include a nozzle head 44. The gas discharge mechanism 43 includes a nozzle head 45. The nozzle heads 44, 45 are respectively mounted on the tips of arms 61, 62 of the nozzle moving mechanism 6 to be described later. The arms 61, 62 extend along horizontal planes. The nozzle moving mechanism 6 moves each nozzle head 44, 45 between a processing position and a retracted position by moving the arm 61, 62.

The nozzle head 44 includes two nozzles 46, 47 and is mounted on the tip of the arm 61. Tip parts (lower end parts) of the nozzles 46, 47 project downward from the lower surface of the nozzle head 44, and upper end parts thereof project upward from the upper surface. One end of a pipe 411 is connected to the upper end of one nozzle 46. The other end of the pipe 411 is connected to a gas supply source 412. Further, a flow controller 413 and an on-off valve 414 are provided in this order from the side of the gas supply source 412 at intermediate positions of the pipe 411. One end of a pipe 421 is connected also to the other nozzle 47. The other end of the pipe 421 is connected to a gas supply source 422. Further, a flow controller 423 and an on-off valve 424 are provided in this order from the side of the gas supply source 422 at intermediate positions of the pipe 421.

Here, if the nozzle moving mechanism 6 locates the nozzle head 44 at the processing position, a discharge port of the nozzle 46 is facing a part of a rotation path of the peripheral edge part of the substrate W rotated by the rotating/holding mechanism 2, and a discharge port of the nozzle 47 is facing another part of this rotation path.

With the nozzle head 44 arranged at the processing position, the inert gas (nitrogen ($N_2$) gas in the shown example) is supplied from the gas supply sources 412, 422 to the nozzles 46, 47. The nozzle 46 discharges the gas flow of the supplied inert gas from above such that the gas flow contacts the position specified in the rotation path of the peripheral edge part of the substrate W. The nozzle 46 discharges the gas flow in a determined direction from the discharge port so that the discharged gas flow flows toward the peripheral edge of the substrate W from this position after reaching this position. The nozzle 47 discharges the gas flow of the supplied inert gas from above such that the gas flow contacts the position specified in the rotation path. The nozzle 47 discharges the gas flow in a determined direction from the discharge port so that the discharged gas flow flows toward the peripheral edge of the substrate W from this position after reaching this position.

The nozzle head 45 of the gas discharge mechanism 43 includes a cylindrical member 93 mounted on the lower surface of a tip part of the arm 62, a disk-like shielding plate 90 mounted on the lower surface of the cylindrical member 93 and a hollow cylindrical nozzle 48. An axis of the cylindrical member 93 and that of the shielding plate 90 coincide and are respectively along the vertical direction. The lower surface of the shielding plate 90 is along a horizontal plane. The nozzle 48 penetrates through the cylindrical member 93 and the shielding plate 90 in the vertical direction such that an axis thereof coincides with those of the shielding plate 90 and the cylindrical member 93. An upper end part of the nozzle 48 further penetrates through the tip part of the arm 62 and is open in the upper surface of the arm 62. One end of a pipe 431 is connected to an upper opening of the nozzle 48. The other end of the pipe 431 is connected to a gas supply source 432. A flow controller 433 and an on-off valve 434 are provided in this order from the side of the gas supply source 432 at intermediate positions of the pipe 431. The lower end of the nozzle 48 is open in the lower surface of the shielding plate 90. This opening is a discharge port of the nozzle 48.

If the nozzle moving mechanism 6 locates the nozzle head 45 at the processing position, the discharge port of the nozzle 48 is facing the vicinity of the center of the upper surface Wu of the substrate W. In this state, the inert gas (nitrogen ($N_2$) gas in the shown example) is supplied from the gas supply source 432 to the nozzle 48. The nozzle 48 discharges the gas flow of the supplied inert gas toward the vicinity of the center of the upper surface Wu of the substrate W. The gas flow radially spreads from a position above the central part of the substrate W toward the peripheral edge of the substrate W. That is, the gas discharge mechanism 43 generates a gas flow spreading from the position above the central part toward the peripheral edge of the substrate W by discharging the inert gas from above the central part of the upper surface Wu of the substrate W.

The processor 5 performs a processing for the processing region on the upper surface peripheral edge part of the substrate W held on the spin chuck 21. Specifically, the processor 5 supplies the processing liquid to the processing region of the substrate W held on the spin chuck 21. The processor 5 includes a processing liquid discharge mechanism 51A. The processing liquid discharge mechanism 51A discharges a flow of the processing liquid such that the liquid flow contacts a part of the peripheral edge part of the upper surface Wu (surface to be processed) of the substrate W held and rotating on the spin chuck 21. The liquid flow is in the form of a liquid column. The processing liquid discharge mechanism 51A includes a nozzle head 50. The nozzle head 50 is mounted on the tip of a long arm 63 provided in the nozzle moving mechanism 6. The arm 63 extends along a horizontal plane. The nozzle moving mechanism 6 moves the nozzle head 50 between a processing position and a retracted position thereof by moving the arm 63.

The nozzle head 50 includes four nozzles 5a to 5d and is mounted on the tip of the arm 63. The nozzles 5a to 5d are arranged in a row along an extending direction of the arm 63. In the nozzle head 50, tip parts (lower end parts) of the nozzles 5a to 5d project downward and base end parts (upper end parts) thereof project upward. A processing liquid supplier 51, which is a piping system for supplying the processing liquid to the nozzles 5a to 5d, is connected to the nozzles 5a to 5d. Specifically, one end of a pipe 511a to 511d of the processing liquid supplier 51 is connected to the upper end of the nozzle 5a to 5d. Each nozzle 5a to 5d has the processing liquid supplied thereto from the processing liquid supplier 51 and discharges the supplied processing liquid from a discharge port in the tip. The processing liquid discharge mechanism 51A discharges the liquid flow of the processing liquid in accordance with a control of the controller 10 from one nozzle determined by control information set in the controller 10, out of the nozzles 5a to 5d.

The processing liquid supplier 51 is specifically configured by combining an SC-1 supply source 52a, a DHF supply source 52b, an SC-2 supply source 52c, a rinse liquid supply source 52d, a plurality of pipes 53a, 53b, 53c and 53d and a plurality of on-off valves 54a, 54b, 54c and 54d. SC-1, DHF and SC-2 are chemicals. Thus, the processing liquid discharge mechanism 51A is a chemical discharger for discharging chemicals to the peripheral edge part of the substrate W.

The SC-1 supply source 52a is a supply source for supplying the SC-1. The SC-1 supply source 52a is connected to the nozzle 5a via the pipe 53a having the on-off valve 54a interposed therein. Thus, if the on-off valve 54a is opened, the SC-1 supplied from the SC-1 supply source 52a is discharged from the nozzle 5a.

The DHF supply source 52b is a supply source for supplying the DHF. The DHF supply source 52b is connected to the nozzle 5b via the pipe 53b having the on-off valve 54b interposed therein. Thus, if the on-off valve 54b is opened, the DHF supplied from the DHF supply source 52b is discharged from the nozzle 5b.

The SC-2 supply source 52c is a supply source for supplying the SC-2. The SC-2 supply source 52c is connected to the nozzle 5c via the pipe 53c having the on-off valve 54c interposed therein. Thus, if the on-off valve 54c is opened, the SC-2 supplied from the SC-2 supply source 52c is discharged from the nozzle 5c.

The rinse liquid supply source 52d is a supply source for supplying a rinse liquid. Here, the rinse liquid supply source 52d supplies, for example, pure water as the rinse liquid. The rinse liquid supply source 52d is connected to the nozzle 5d via the pipe 53d having the on-off valve 54d interposed therein. Thus, if the on-off valve 54d is opened, the rinse liquid supplied from the rinse liquid supply source 52d is discharged from the nozzle 5d. Note that pure water, hot water, ozone water, magnetic water, reduced water (hydrogen water), various organic solvents (ion water, IPA (isopropyl alcohol), functional water ($CO_2$ water, etc.) and the like may be used as the rinse liquid.

The processing liquid supplier 51 selectively supplies the SC-1, DHF, SC-2 and rinse liquid. If the processing liquid (SC-1, DHF, SC-2 or rinse liquid) is supplied from the processing liquid supplier 51 to the corresponding one of the nozzles 5a to 5d, this nozzle discharges the liquid flow of this processing liquid such that the liquid flow contacts the processing region of the upper surface peripheral edge part of the rotating substrate W. Each of the on-off valves 54a, 54b, 54c and 54d provided in the processing liquid supplier 51 is opened and closed under the control of the controller 10 by an unillustrated valve opening/closing mechanism electrically connected to the controller 10. That is, a discharge mode (specifically, the type of the processing liquid to be discharged, a discharge start timing, a discharge end timing, a discharge flow rate, etc.) of the processing liquid from the nozzle of the nozzle head 50 is controlled by the controller 10. Specifically, the processing liquid discharge mechanism 51A discharges the liquid flow of the processing liquid by the control of the controller 10 such that the liquid flow contacts the position of the rotation path of the upper surface peripheral edge part of the substrate W rotating about the axis of rotation a1.

The nozzle moving mechanism 6 is a mechanism for moving each of the gas discharge mechanisms 41 to 43 and the nozzle head 50 of the processing liquid discharge mechanism 51A between the processing position and the retracted position thereof. The nozzle moving mechanism 6 includes the horizontally extending arms 61 to 63, nozzle bases 64 to 66 and drivers 67 to 69.

Base end parts of the arms 61 to 63 are coupled to upper end parts of the nozzle bases 64 to 66. The nozzle bases 64 to 66 are distributed and arranged around the casing 24 in such postures that axes thereof are along the vertical direction. Each of the nozzle bases 64 to 66 includes a rotary shaft extending in the vertical direction along the axis thereof and rotatable about the axis. The axes of the nozzle bases 64 to 66 and those of the respective rotary shafts coincide. The upper end parts of the nozzle bases 64 to 66 are respectively mounted on the upper ends of the respective rotary shafts. By the rotation of each rotary shaft, the upper end part of each nozzle base 64 to 66 rotates about the axis of each rotary shaft, i.e. the axis of the nozzle base 64 to 66. The nozzle bases 64 to 66 are provided with the drivers 67 to 69 for rotating the rotary shafts thereof about the axes. Each of the drivers 67 to 69 includes, for example, a stepping motor or the like.

Each of the drivers 67 to 69 rotates the upper end part of the nozzle base 64 to 66 via the rotary shaft of the nozzle base 64 to 66. According to the rotation of each upper end part, the nozzle head 44, 45, 50 also rotates about the axis of the nozzle base 64 to 66. In this way, each of the drivers 67 to 69 horizontally moves the nozzle head 44, 45, 50 between the processing position and the retracted position thereof.

If the nozzle head 44 is arranged at the processing position, the discharge port of the nozzle 46 is facing a part of the rotation path of the peripheral edge part of the substrate W rotated by the rotating/heating mechanism 2 and the discharge port of the nozzle 47 is facing another part of the rotation path.

If the nozzle head 45 is arranged at the processing position, the discharge port of the nozzle 48 is located above the center c1 of the substrate W and the axis of the nozzle 48 coincides with the axis of rotation a1 of the spin chuck 21. The discharge port (lower opening) of the nozzle 48 is facing the central part of the substrate W. Further, the lower surface of the shielding plate 90 is facing in parallel to the upper surface Wu of the substrate W. The shielding plate 90 is proximate to the upper surface Wu of the substrate W without contacting the upper surface Wu.

If the nozzle head 50 is arranged at the processing position, the nozzles 5a to 5d are arranged at the processing position. Standby positions of the nozzle heads 44, 45 and 50 are positions where these nozzle heads do not interfere with a conveyance path for the substrate W and do not interfere with each other. Each standby position is outside and above the splash guard 31.

Figure 3:
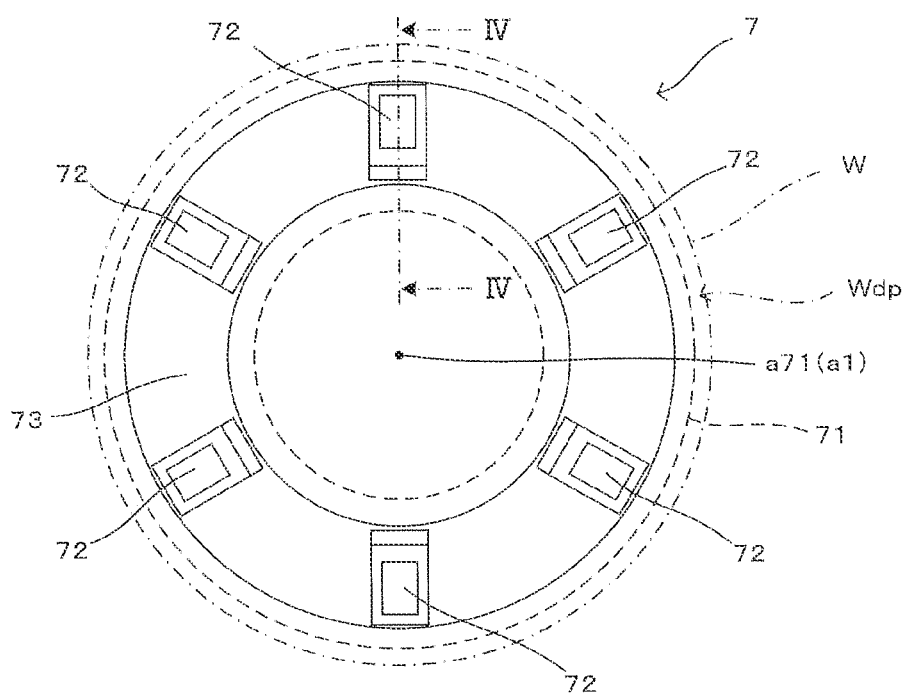
FIG. 3 is a plan view of the heating mechanism viewed from the vertical direction.
Figure 4A:
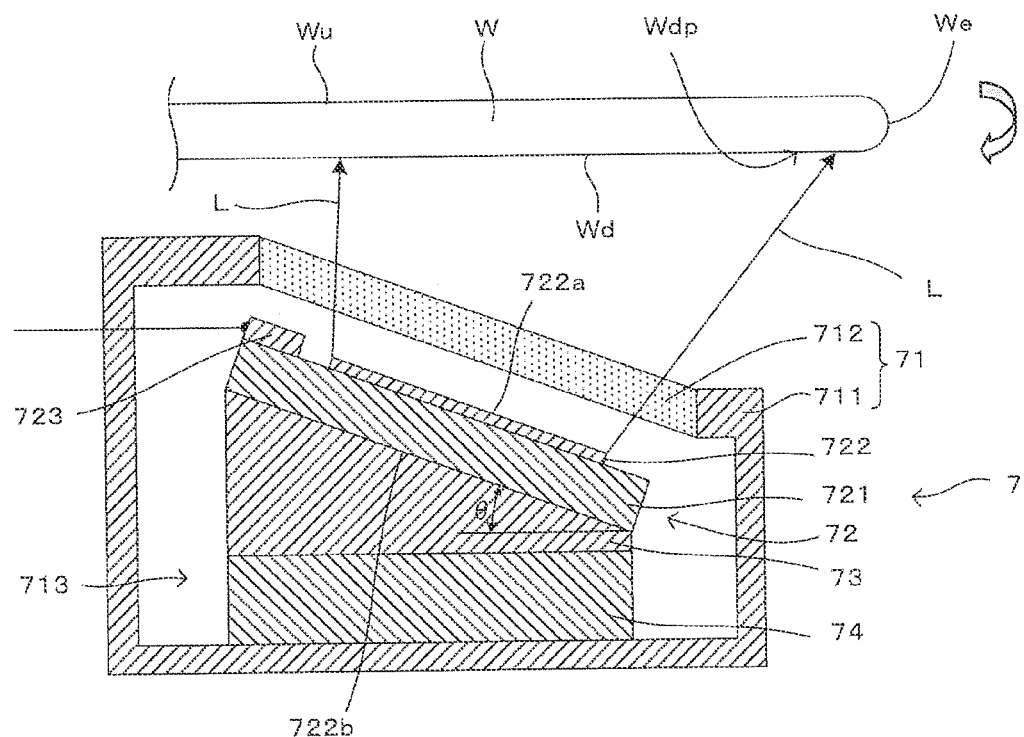
FIG. 4A is a sectional view along line IV-IV of FIG. 3.
Figure 4B:
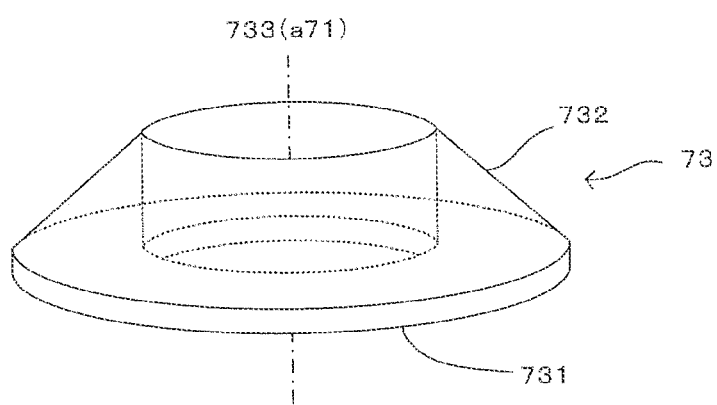
FIG. 4B is a perspective view showing the structure of a heat sink as one component of the heating mechanism.

The heating mechanism 7 is provided below a lower surface Wd of the substrate W held by the spin chuck 21. The structure and operation of the heating mechanism 7 are described in detail below with reference to FIGS. 3, 4A and 4B. FIG. 3 is a plan view of the heating mechanism viewed from the vertical direction. FIG. 4A is a sectional view along line IV-IV of FIG. 3. FIG. 4B is a perspective view showing the structure of a heat sink as one component of the heating mechanism. Note that a heating housing 71 and the substrate W are respectively shown by broken lines and one-dot chain line in FIG. 3 to clearly show the internal structure of the heating mechanism 7.

As shown in FIGS. 1 to 3, the heating mechanism 7 is provided below the lower surface Wd of the substrate W and closer to the axis of rotation a1 than an end surface We (FIG. 4A) of the substrate W. The heating mechanism 7 includes the heating housing 71 made of resin and having an annular shape in a plan view from above. An outer diameter of the heating housing 71 is smaller than that of the substrate W. A rotational symmetry axis a71 of the heating housing 71 coincides with the axis of rotation a1 of the spin chuck 21. Thus, when viewed vertically from below, the heating housing 71 is arranged concentrically with the substrate W inside (side of the axis of rotation a1) a lower surface peripheral edge part Wdp of the substrate W held by the spin chuck 21.

As shown in FIG. 4A, the heating housing 71 includes a box member 711 open upward and a transparent member 712 arranged to close an annular opening of the box member 711 from above. Light emitting elements 72 functioning as heating sources, a heat sink 73 and a base member 74 are stored in a substantially torus (doughnut-shaped) storage space 713 formed by these box member 711 and transparent member 712. As described later, if the light emitting element 72 is turned on, light from the light emitting element 72 is irradiated toward the lower surface peripheral edge part Wdp of the substrate W via the transparent member 712. As just described, the entire transparent member 712 functions as a transmission window in the first embodiment. However, the range of the transmission window may be limited by covering the upper or lower surface of the transparent member 712 with a light shielding member except a light transmission region where the light from the light emitting element 72 transmits. Further, the annular opening of the box member 711 may be covered with a light shielding member to close the annular opening of the box member 711 from above, an opening may be provided in a region of the light shielding member corresponding to the light transmission region, and a transparent member may be fit into this opening and function as a transmission window.

The base member 74 having a circular annular shape to correspond to the heating housing 71 is arranged in an inner bottom part of the storage space 713. The base member 74 is constituted by an aluminum plate. The heat sink 73 made of metal is arranged on this base member 74. The heat sink 73 functions to cool the light emitting elements 72 while supporting the light emitting elements 72 by being held in close contact with bottom surfaces 722b of the light emitting elements 72, which are surfaces opposite to a light emitting surfaces 722a. More specifically, the heat sink 73 has the same planar shape as the base member 74, i.e. has an annular bottom surface 731 as shown in FIG. 4B. The side surface of the heat sink 73 is an inclined surface 732 and finished to be inclined downward in a radial direction from a rotational symmetry axis 733. In this embodiment, an inclination angle θ is set to be 10° to 20°. The heat sink 73 having such an appearance shape is so fixed to the base member 74 that the rotational symmetry axis 733 substantially coincides with the rotational symmetry axis a71 of the heating housing 71. Further, inside the heat sink 73, cooling water is circulated by an unillustrated cooling water circulation supplier. In this way, the light emitting elements 72 are cooled. Since the heat sink 73 cools the light emitting elements 72 while being held in close contact with the bottom surfaces 722b of the light emitting elements 72, the light emitting elements 72 can be efficiently cooled.

The light emitting elements 72 such as the already described ultraviolet light emitting LEDs are arranged on the inclined surface 732 of the heat sink 73 to face the lower surface peripheral edge part Wdp of the substrate W via the transparent member (transmission window) 712. In the first embodiment, six light emitting elements 72 are radially arrayed on the inclined surface 732 of the heat sink 73 at equal angular intervals (intervals of 60°) about the rotational symmetry axis 733 of the heat sink 73. Each light emitting element 72 includes an element substrate 721, a light emitter 722 for emitting light (ultraviolet rays) and a connector 723 for delivering and receiving a control signal and a temperature detection signal of the light emitter 722 to and from the controller 10. The light emitter 722 and the connector 723 are adjacently mounted on one principal surface of the element substrate 721. The light emitting element 72 is fixed to the inclined surface 732 of the heat sink 73 with the light emitter 722 and the connector 723 facing toward the substrate W. Thus, the six light emitting elements 72 are all arranged to be inclined from a horizontal plane by the above inclination angle θ so that the light emitting surfaces 722a face the lower surface peripheral edge part Wdp of the substrate W.

In the light emitting element 72 thus configured, when a turn-on signal from the controller 10 is received via the connector 723, the light emitter 722 is turned on and emits ultraviolet light L toward the lower surface peripheral edge part Wdp of the substrate W. The ultraviolet light L is irradiated to the lower surface peripheral edge part Wdp of the substrate W rotating about the axis of rotation a1 and its vicinity via the transparent member 712. In this way, the substrate peripheral edge part is heated to reach a desired temperature.

Figure 5:
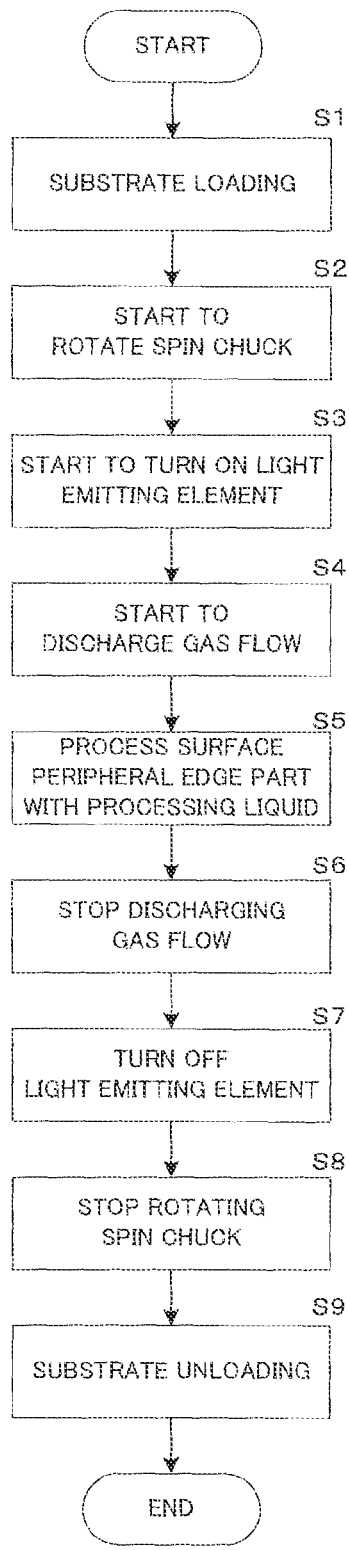
FIG. 5 is a flow chart showing an example of a substrate processing operation by the substrate processing apparatus shown in FIG. 1.

FIG. 5 is a flow chart showing an example of a substrate processing operation by the substrate processing apparatus shown in FIG. 1. In the substrate processing apparatus 1 configured as described above, the controller 10 controls each apparatus component as follows in accordance with the procedure described in the program. If an unprocessed substrate W is loaded into the substrate processing apparatus 1 from outside the apparatus by an unillustrated conveyor robot or the like and placed on the upper surface of the spin chuck 21, the spin chuck 21 holds the substrate W (Step S1: substrate loading). Further, the conveyor robot is retracted from the substrate processing apparatus 1. Subsequent to that, the nozzle heads 44, 45 and 50 are arranged at the processing position by the nozzle moving mechanism 6 and the splash guard 31 is arranged at an upper position by the guard driving mechanism.

If the preparation of the substrate processing is completed in this way, the rotating mechanism 231 of the substrate processing apparatus 1 starts to rotate the spin chuck 21 holding the substrate W (Step S2). A rotation speed of the substrate W is, for example, set at 1800 rpm. Further, all the light emitters 722 are turned on upon receiving turn-on signals from the controller 10 (Step S3). In this way, ultraviolet light L is emitted from the light emitting surface 722a of each light emitter 722, and irradiated to the lower surface peripheral edge part Wdp of the rotating substrate W via the transparent member 712. In this way, the heating of the peripheral edge part of the substrate W is started.

Subsequently, the gas discharge mechanisms 41, 42 start to discharge gas flows of the inert gas from the nozzles 46, 47 of the nozzle head 44, and the gas discharge mechanism 43 starts to discharge a gas flow of the inert gas from the nozzle 48 of the nozzle head 45 (Step S4).

After the temperature of the peripheral edge part of the substrate W rises and is stabilized by the passage of time, the processing liquid discharge mechanism 51A discharges the liquid flow of the processing liquid (chemical) such that the liquid flow contacts the upper surface peripheral edge part of the substrate W to process the upper surface peripheral edge part (Step S5). If the controller 10 detects the passage of a processing time or the like required for the processing of the substrate W, the processing liquid discharge mechanism 51A stops discharging the processing liquid.

Subsequent to that, the light emitters 722 are turned off upon receiving turn-off signals from the controller 10 and the heating of the peripheral edge part of the substrate W is stopped (Step S6). Further, the discharge of the gas flows is also stopped (Step S7). Furthermore, the rotation of the spin chuck 21 is stopped (Step S8). Thereafter, if a hand of the unillustrated conveyor robot enters the substrate processing apparatus 1 and receives the processed substrate W, the holding of the substrate W by the spin chuck 21 is released. Then, the conveyor robot unloads the received substrate W to a next substrate processing apparatus (Step S9: unloading).

As described above, according to this embodiment, the six light emitting elements 72 are all arranged to be inclined from the horizontal surface and the light emitting surfaces 722a are facing the lower surface peripheral edge part Wdp of the substrate W. Thus, the ultraviolet light L emitted from the light emitting surfaces 722a of the light emitting elements 72 is irradiated to the lower surface peripheral edge part Wdp of the substrate W or the vicinity thereof. Therefore, the peripheral edge part of the substrate W can be efficiently heated. As a result, a time required until the peripheral edge part of the substrate W reaches a predetermined temperature and is stabilized, i.e. a time from the discharge start of the gas flows (Step S4) to the discharge start of the processing liquid (Step S5) can be shortened. As a result, a tact time required for the substrate processing can be shortened.

Figure 6:
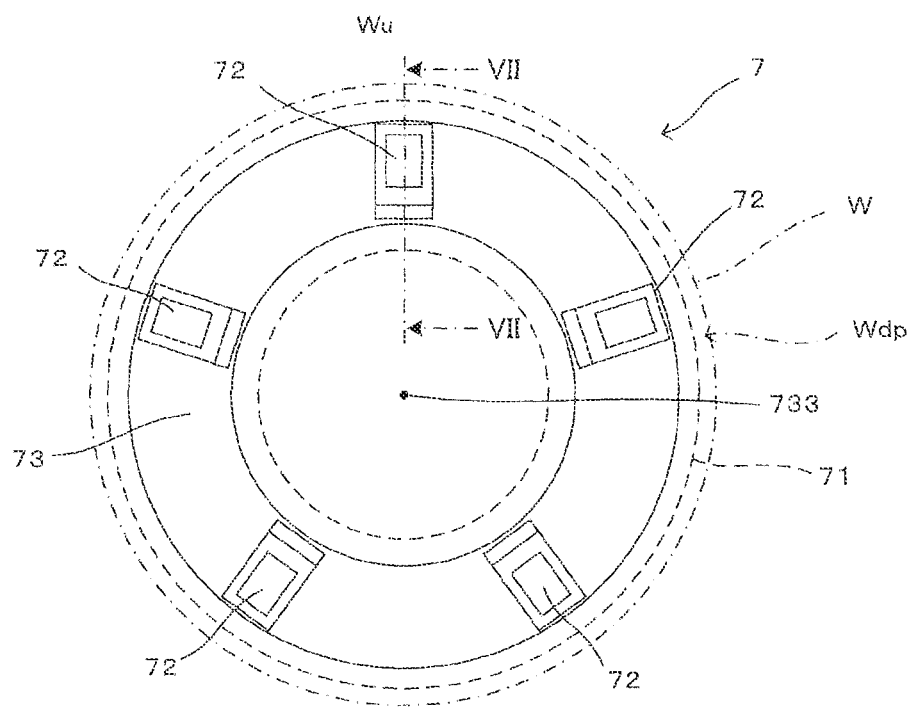
FIG. 6 is a diagram showing the arrangement of light emitting elements in the comparative example of a heating mechanism.
Figure 7:
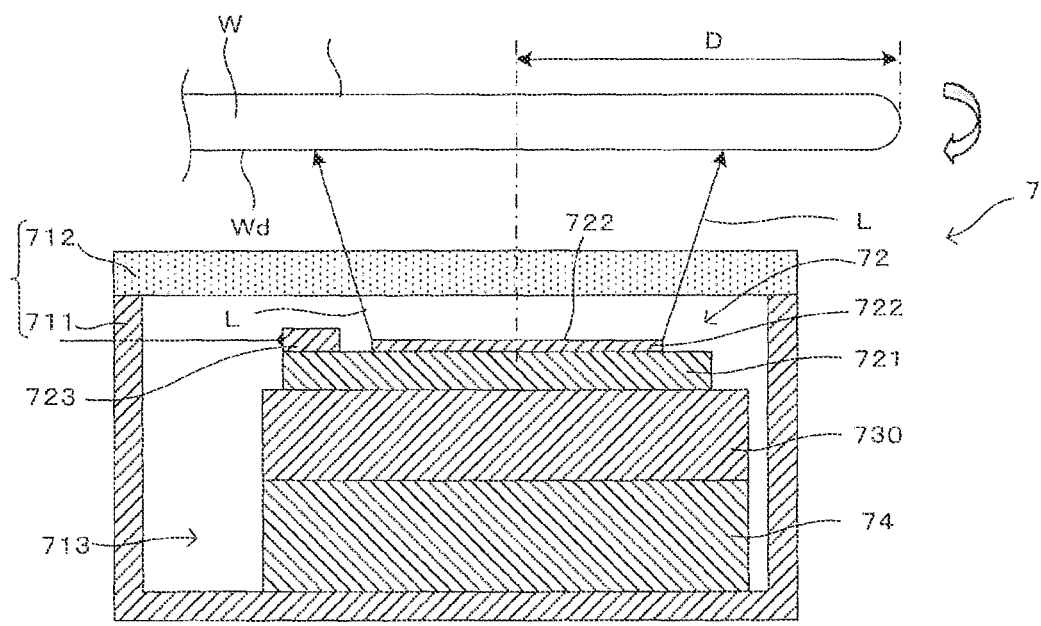
FIG. 7 is a sectional view along line VII-VII of FIG. 6.
Figure 8:
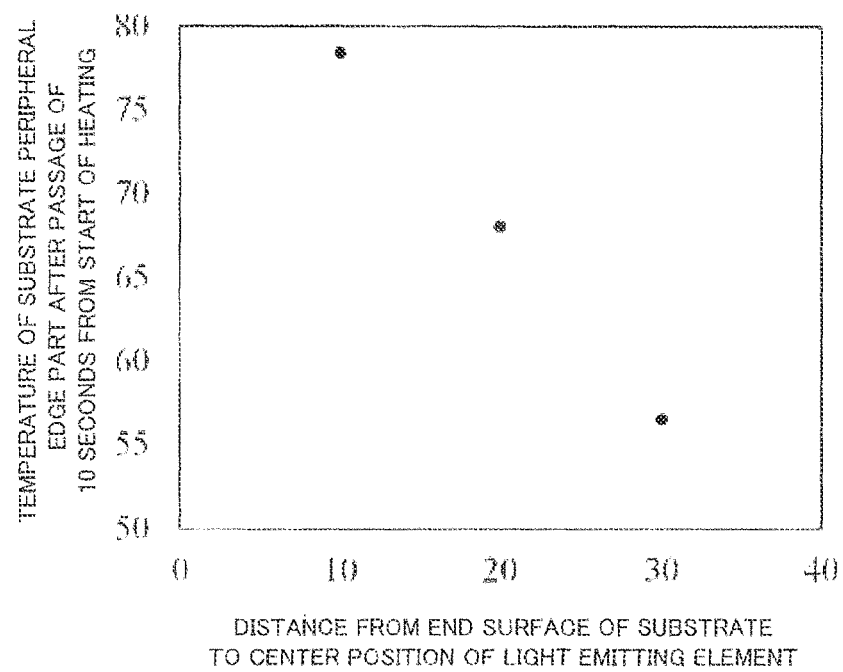
FIG. 8 is a graph showing the influence of a distance from an end surface of a substrate to a center position of a light emitting surface on the temperature rise characteristic.

Here, to more clarify functions and effects of this embodiment, a temperature rise of a substrate peripheral edge part in a comparative example shown in FIGS. 6 and 7 (apparatus in which light emitting surfaces 722a are horizontally set) was examined. As a result, a temperature rise characteristic shown in FIG. 8 was found. FIG. 6 is a diagram showing the arrangement of light emitting elements in the comparative example of a heating mechanism. FIG. 7 is a sectional view along line VII-VII of FIG. 6. FIG. 8 is a graph showing the influence of a distance from an end surface of a substrate to a center position of a light emitting surface on the temperature rise characteristic.

A heating mechanism 70 according to the comparative example largely differs from the heating mechanism 7 provided in the first embodiment roughly in two points, i.e. that the number of light emitting elements 72 is five, which is one less than the heating mechanism 7, and that a heat sink 730 in the form of a circular annular flat plate is used. In the comparative example, the light emitting elements 72 are arranged on the upper surface of the heat sink 730 and inclination angles θ of light emitting surfaces 722a are zero. That is, the light emitting surfaces 722a are arranged in parallel to a horizontal plane. Note that the light emitting elements 72 used are the same as in the first embodiment. Thus, a light quantity per light emitting element 72 is 144 W and that of the entire heating mechanism 70 is 720 W. Then, the ultraviolet light L was irradiated toward the substrate W rotating at 1800 rpm while setting a distance D from the end surface We of the substrate W to the center position of the light emitting element 72 (light emitting surface 722a) to 10 mm, 20 mm and 30 mm. The temperature of the substrate peripheral edge part after the passage of 10 seconds from the start of heating was measured and the measured temperature at each distance D was plotted in the graph of FIG. 8.

As can be understood from FIG. 8, as the distance D becomes longer, i.e. with distance from the end surface We of the substrate W, the reached temperature of the substrate peripheral edge part becomes lower and a time required to increase the temperature of the substrate peripheral edge part to a temperature suitable for the substrate processing by the processing liquid becomes longer. Conversely, the heating time can be shortened by bringing the light emitting elements 72 closer to the end surface We of the substrate W. However, a space allowing the arrangement of the light emitting elements 72 is limited to a range right below the lower surface of the substrate W and away from the end surface We of the substrate W toward the axis of rotation a1 due to layout restrictions of each apparatus component. Thus, in terms of shortening the heating time, it is desirable to arrange the light emitting elements 72 at the distance D=10 mm, i.e. arrange the light emitting elements 72 at positions right below the lower surface peripheral edge part Wdp of the substrate W. However, the light emitting elements 72 actually need to be arranged at positions where D=20 mm to 30 mm or even longer. In contrast, since the light emitting surfaces 72 are inclined to face toward the lower surface peripheral edge part Wdp of the substrate W in the heating mechanism 7 of the first embodiment. Therefore, the ultraviolet light L can be irradiated to the lower surface peripheral edge part Wdp of the substrate W or the vicinity thereof and the light emitting elements 72 can be heated in a shorter time than in the comparative example with the horizontal arrangement even if the light emitting elements 72 are somewhat distant from the end surface We of the substrate W. Further, to obtain desired heating performance while arranging the light emitting elements 72 in a mode shown in the comparative example at the same positions as in the first embodiment, nine light emitting elements 72, which are more than those (six light emitting elements) of the heating mechanism 7 of the first embodiment, need to be provided in design. As just described, according to the first embodiment, the number of the light emitting elements 72 can be reduced and the first embodiment is more advantageous than the comparative example in terms of apparatus size and running cost.

The light emitting surfaces 722a are obliquely arranged in the first embodiment. This increases an incident angle of the ultraviolet light L on the lower surface peripheral edge part Wdp of the substrate W as shown in FIG. 4A. As a result, a reflection angle of reflected light RL reflected by the lower surface peripheral edge part Wdp also becomes large. Thus, the reflected light RL possibly enters deep into the inside of the apparatus. Accordingly, as shown in FIG. 9, the heating mechanism 7 may be surrounded with a heat resistant light shielding member 75 having a light shielding property (second embodiment).

Figure 9:
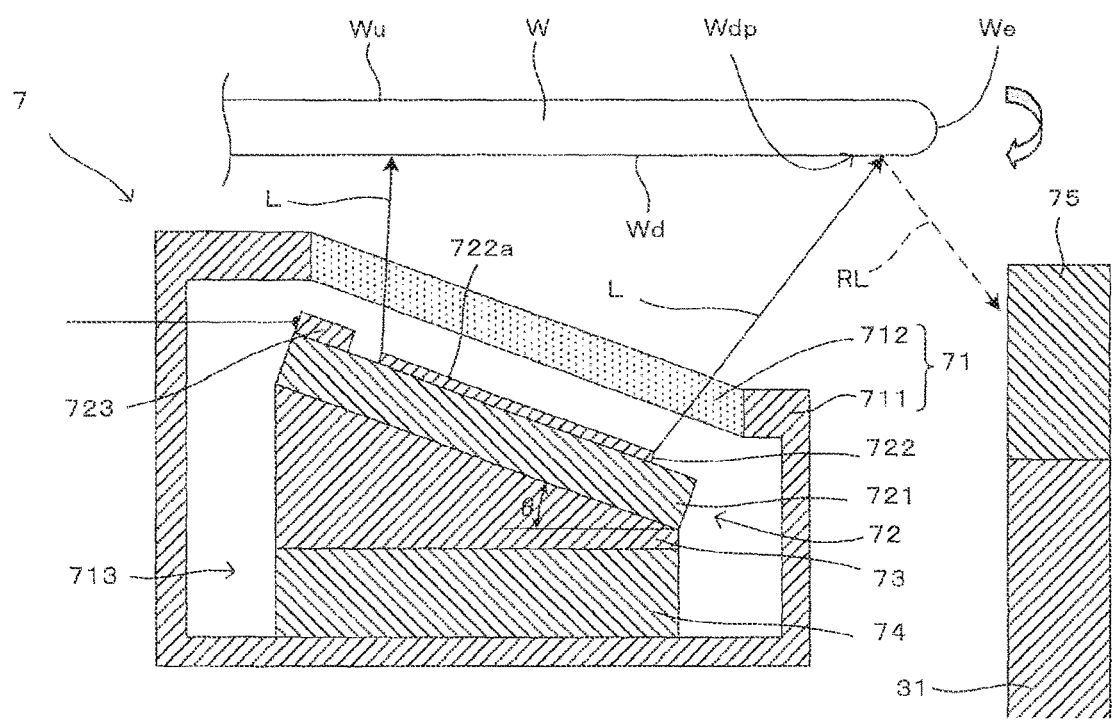
FIG. 9 is a diagram showing a heating mechanism equipped in the second embodiment of the substrate processing apparatus according to the invention.

FIG. 9 is a diagram showing a heating mechanism equipped in the second embodiment of the substrate processing apparatus according to the invention. In the second embodiment, as shown in FIG. 9, the heat resistant light shielding member 75 is mounted on a part of a splash guard 31. A cover member made of PTFE (polytetrafluoroethylene) can be, for example, used as the light shielding member 75. By covering the heating mechanism 7 from a side opposite to an axis of rotation a1 by the light shielding member 75 in this way, the influence of reflected light RL on the inside of the apparatus can be effectively prevented. Further, as is clear from the comparison with the comparative example, the number of light emitting elements 72 can be reduced. Thus, an array mode of the light emitting elements 72 may be, for example, changed as shown in FIG. 10 (third embodiment).

Figure 10:
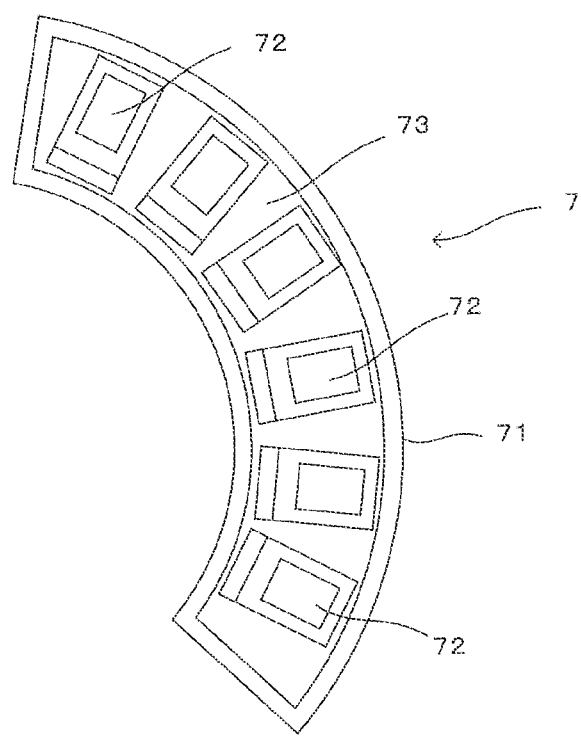
FIG. 10 is a diagram showing a heating mechanism equipped in the third embodiment of the substrate processing apparatus according to the invention.

FIG. 10 is a diagram showing a heating mechanism equipped in the third embodiment of the substrate processing apparatus according to the invention. The third embodiment largely differs from the first embodiment in that the shapes of a heating housing 71, a heat sink 73 and a base member 74 are substantially fan-shaped in a plan view from above and that six light emitting elements 72 are arranged on a substantially fan-shaped inclined surface 732 of the heat sink 73. That is, the light emitting elements 72 are distributed and arranged at equal angular intervals about the axis of rotation a1 in the first embodiment, whereas the six light emitting elements 72 are arranged in a concentrated manner in a substantially fan-shaped region in a plan view from above in the third embodiment. Therefore, in the third embodiment, an occupancy of the heating mechanism 7 in the substrate processing apparatus 1 is reduced and a degree of freedom in designing the apparatus can be enhanced.

Further, although the inclination angles θ of the light emitting surfaces 722a are fixed in the first to third embodiments, the inclination angle θ may be adjustable (fourth embodiment).

Figure 11:
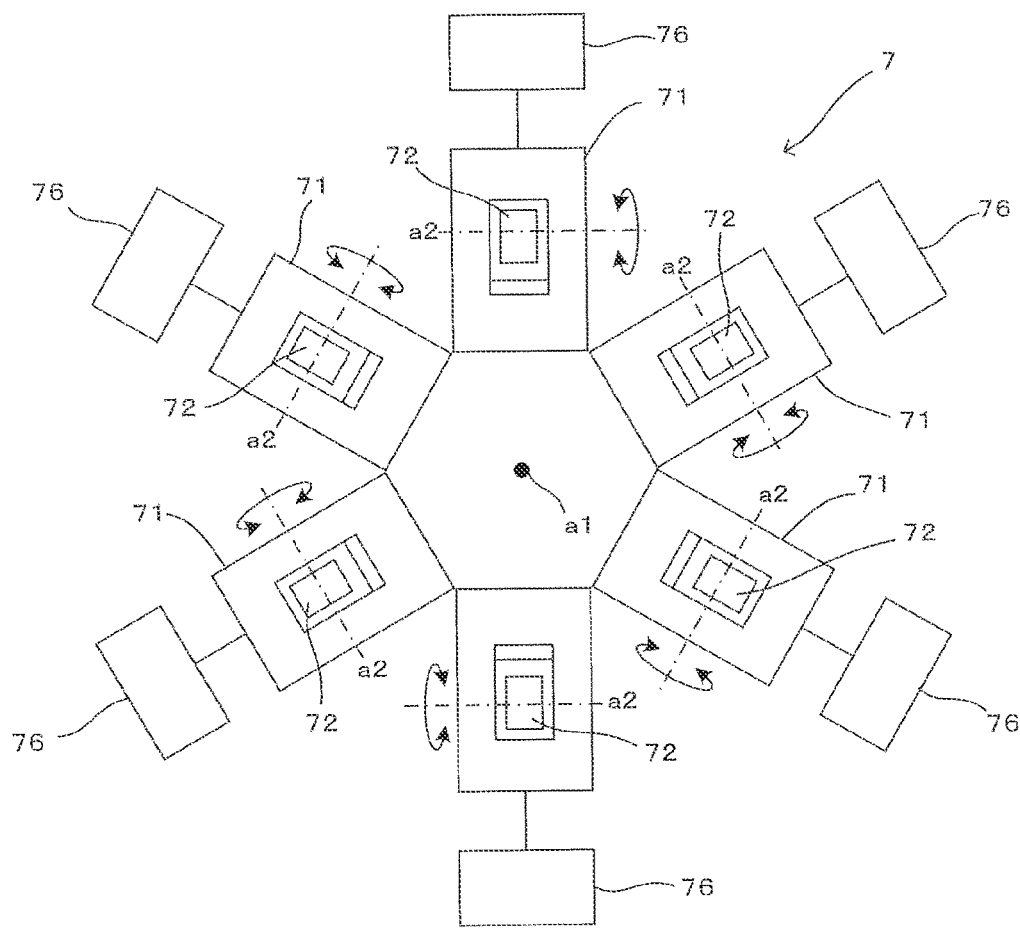
FIG. 11 is a diagram showing a heating mechanism equipped in the fourth embodiment of the substrate processing apparatus according to the invention.
Figure 12:
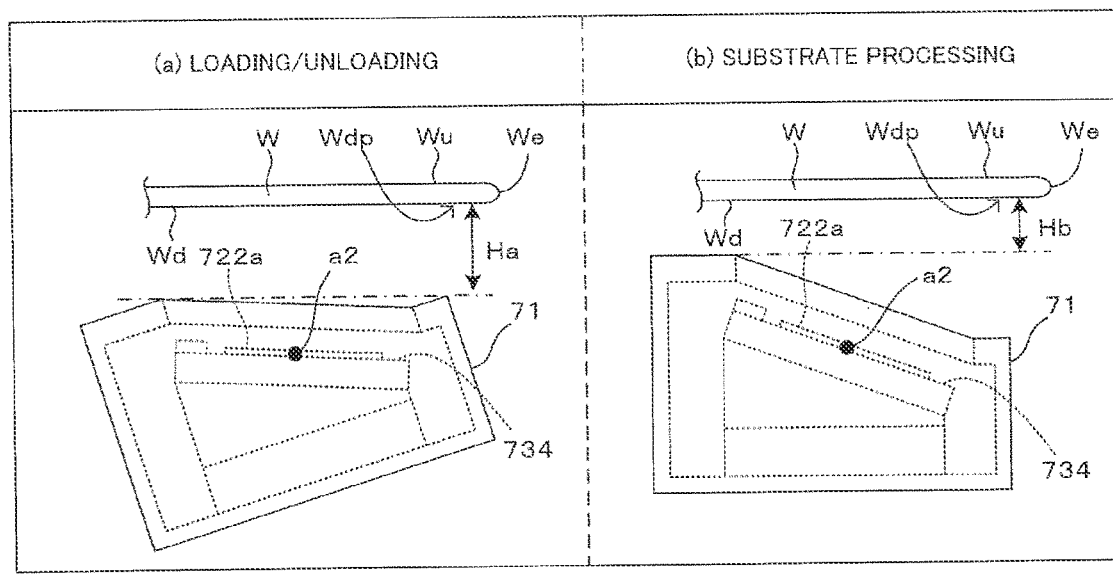
FIG. 12 is a chart showing an example of the operation of the heating mechanism in the fourth embodiment.

FIG. 11 is a diagram showing a heating mechanism equipped in the fourth embodiment of the substrate processing apparatus according to the invention. FIG. 12 is a chart showing an example of the operation of the heating mechanism in the fourth embodiment. In this fourth embodiment, as many heating housings 71 as light emitting elements 72 are distributed and arranged at equal angular intervals about an axis of rotation a1 as a whole as shown in FIG. 11. One light emitting element 72 is stored in each heating housing 71. That is, a base member 74 and a heat sink 73 are stacked in an inner bottom part of the heating housing 71. The heat sink 73 is a block body inclined downward in a radial direction from the axis of rotation a1, i.e. having an inclined surface 734 in the form of a so-called shed roof. The light emitting element 72 is fixed on the inclined surface 734. Thus, also in the fourth embodiment, a light emitting surface 722a is facing toward a lower surface peripheral edge part Wdp of a substrate W in each light emitting element 72.

Further, each heating housing 71 is supported rotatably about an axis of rotation a2 orthogonal to an inclination direction of the light emitting surface 722a and extending in a parallel width direction of the light emitting surface 722a while passing through a central part of the light emitting surface 722a. An inclination angle adjuster 76 is connected to each heating housing 71. Thus, the inclination angle adjuster 76 rotates the heating housing 71 about the axis of rotation a2 according to a rotation command from a controller 10, whereby the inclination of the light emitting surface 722a with respect to a horizontal plane can be arbitrarily set. In the fourth embodiment, when the substrate W is loaded (Step S1) and unloaded (Step S9), the inclination angle adjuster 76 positions the heating housing 71 such that the light emitting surface 722a is substantially parallel to the horizontal plane. On the other hand, the inclination angle adjuster 76 positions the heating housing 71 such that the light emitting surface 722a faces the lower surface peripheral edge part Wdp of the substrate W held by a spin chuck 21 at other times, i.e. during a substrate processing.

In the fourth embodiment thus configured, ultraviolet light L emitted from the light emitting surface 722a is irradiated to the lower surface peripheral edge part Wdp and the vicinity thereof as shown in FIG. 12(b) and the peripheral edge part of the substrate W can be efficiently heated during the substrate processing. On the other hand, during the loading/unloading of the substrate W, an interval Ha in the vertical direction between the substrate W on the spin chuck 21 and the heating housing 71 becomes wider than an interval Hb during the substrate processing as shown in FIG. 12(a). Thus, a movable space of a hand of a conveyor robot during loading/unloading is expanded and an operation of transferring the substrate W to the spin chuck 21 can be stably performed.

Further, if the ultraviolet light L emitted from the light emitting surface 722a continues to be irradiated in a certain direction, the temperature of a substrate region directly irradiated with the ultraviolet light L may suddenly rise and a temperature difference from an adjacent substrate region may become larger. The substrate W is possibly warped due to this temperature difference. In the case of processing the substrate W in which such warping is prominent, the inclination angle θ may be continuously or intermittently changed, i.e. the light emitting element 72 may be swung, by the operation of the inclination angle adjuster 76 while the ultraviolet light L is continuously emitted from the light emitting surface 722a. In this way, the warping of the substrate W can be suppressed and the quality of the substrate processing can be improved.

Further, the inclination angle adjuster 76 may be configured to adjust the inclination angle θ during the substrate processing according to the type of the substrate W. In this way, various substrates W can be dealt with and the versatility of the substrate processing apparatus 1 can be enhanced.

As described above, in the first to fourth embodiments, the lower surface Wd and the upper surface Wu of the substrate W respectively correspond to "one principal surface of a substrate" and "another principal surface of the substrate" of the invention. Further, the loading and unloading of the substrate W correspond to examples of "loading of the substrate" and "unloading of the substrate" of the invention.

Note that the invention is not limited to the embodiments described above and various changes other than the aforementioned ones can be made without departing from the gist of the invention. For example, although the number of the light emitting elements 72 is set to six in the embodiments, there is no limitation to this. A number corresponding to the temperature of the substrate peripheral edge part required for the substrate processing may be set.

Further, although the LEDs for emitting the ultraviolet light L are used as the light emitting elements 72 in the above embodiments, a wavelength range of light emitted from the light emitting elements 72 is not limited to this. However, since the substrate peripheral edge part is heated by irradiating light to the lower surface Wd of the substrate W, it is desirable to avoid the arrival of the light at a device formed on the upper surface Wu of the substrate W. Accordingly, for example, when a thickness of the substrate W is 775 μm, a penetration length of the light L needs to be suppressed to 100 μm or less to set transmittance into the upper surface Wu of the substrate W to 0.01% or less. Here, a relationship of a wavelength and a penetration length of light in the case of silicon described in "Handbook of Optical Constants of Solids" is referred to. If the wavelength of the light L is set to 950 nm or less, the transmittance is 0.01% or less and a possibility of affecting the device is small. On the other hand, the light L having a wavelength of 300 nm or less possibly cuts silicon bond. Thus, if the substrate W is a silicon substrate, the use of light emitting elements for emitting light having a wavelength of 300 nm to 950 nm is preferable.

Although the invention has been described along with the specific embodiment above, this description is not intended to be interpreted in a limited sense. If the description of the invention is referred to, various modifications of the disclosed embodiment would be apparent to a person skilled in this art, similarly to other embodiments of the invention. Therefore, the appended claims are through to include these modifications or embodiments without departing from the true scope of the invention.

This invention can be applied to substrate processing techniques in general for processing a substrate by supplying a processing liquid to the substrate while heating a peripheral edge part of the substrate in a non-contact manner.

What is claimed is:

1. A substrate processing apparatus, comprising:
   a substrate holder configured to hold a substrate substantially horizontally, the substrate holder being rotatable about a predetermined axis of rotation;
   a rotating mechanism configured to rotate the substrate holder about the axis of rotation;
   a heating mechanism including a light emitting element and configured to heat the substrate by irradiating light to one principal surface of the substrate, the light emitting element arranged at a position right below the one principal surface of the substrate rotating about the axis of rotation and away from an end surface of the substrate toward the axis of rotation so that the light emitting element inclines from a horizontal plane and faces a peripheral edge part of the substrate, thereby irradiating the light emitted from a light emitting surface of the light emitting element directly to the peripheral edge part of the substrate; and
   a processing liquid discharge mechanism configured to discharge a processing liquid to another principal surface of the substrate heated by the heating mechanism.

2. The substrate processing apparatus according to claim 1, wherein:
   the heating mechanism includes an inclination angle adjuster configured to adjust an inclination angle of the light emitting surface with respect to the horizontal plane.

3. The substrate processing apparatus according to claim 2, wherein:
   the inclination angle adjuster is configured to adjust the inclination angle according to type of the substrate.

4. The substrate processing apparatus according to claim 2, wherein:
   the inclination angle adjuster continuously or intermittently changes the inclination angle while the light is continuously emitted from the light emitting surface.

5. The substrate processing apparatus according to claim 2, wherein:
   the inclination angle adjuster is configured to adjust the inclination angle so that the light emitting surface is horizontal, whereby a gap while the substrate is loaded and unloaded between outside of the apparatus and the substrate holder is wider than the gap while the light is emitted from the light emitting surface, the gap being a distance between the heating mechanism and the substrate holder in a vertical direction.

6. The substrate processing apparatus according to claim 1, further comprising a light shielding member configured to shield reflected light reflected by the one principal surface of the substrate by surrounding the heating mechanism from a side opposite to the axis of rotation.

7. The substrate processing apparatus according to claim 1, further comprising a heat sink, wherein:
   the light emitting element has a bottom surface opposite to the light emitting surface, and
   the heat sink is configured to support the light emitting surface while being held in close contact with the bottom surface of the light emitting element.

8. The substrate processing apparatus according to claim 7, wherein:
   the heat sink includes a bottom surface and an inclined surface that is finished to be inclined downward in a radial direction from the axis of rotation; and
   the bottom surface of the light emitting element is supported by the inclined surface of the heat sink.

* * * * *